United States Patent [19]

Yamawaki et al.

[11] 4,096,822
[45] Jun. 27, 1978

[54] GASEOUS ATMOSPHERE CONTROL APPARATUS FOR A SEMICONDUCTOR MANUFACTURING SYSTEM

[75] Inventors: Masao Yamawaki, Handa; Katsuo Aoki, Aichi; Yoshio Oka, Toyota; Takao Suzuki, Kariya; Osamu Ina, Okazaki; Kunihiko Hara, Kariya, all of Japan

[73] Assignee: Nippondenso Co., Ltd., Kariya, Japan

[21] Appl. No.: 727,772

[22] Filed: Sep. 29, 1976

[30] Foreign Application Priority Data

Sep. 29, 1975  Japan ............................. 50-117409

[51] Int. Cl.² .......................................... C23C 11/00
[52] U.S. Cl. ........................................ 118/48; 118/500
[58] Field of Search ............... 118/48, 49, 49.1, 49.5, 118/500; 148/189; 432/258, 259

[56] References Cited

U.S. PATENT DOCUMENTS

| 3,461,836 | 8/1969 | Henker .................................. 118/48 |
| 3,602,192 | 8/1971 | Grochowski et al. ............ 118/500 X |
| 3,678,893 | 7/1972 | Bell .................................... 148/189 X |
| 3,750,620 | 8/1973 | Eversteijn et al. ...................... 118/48 |
| 3,922,467 | 11/1975 | Pinchon ............................. 118/48 X |
| 4,018,183 | 4/1977 | Meuleman ............................. 118/49 |
| 4,018,184 | 4/1977 | Nagasawa et al. ................. 118/49.1 |
| 4,069,009 | 1/1978 | Yamawaki et al. ................. 432/122 |

OTHER PUBLICATIONS

Eshbach et al., IBM Technical Disclosure Bulletin, vol. 13, No. 6, Nov. 1970.

*Primary Examiner*—Wm. Carter Reynolds
*Attorney, Agent, or Firm*—Cushman, Darby & Cushman

[57] ABSTRACT

A gaseous atmosphere control apparatus for heat-treating semiconductors in a uniform gaseous atmosphere condition is disclosed. The control apparatus is provided with a reaction pipe through which semiconductor wafers are transferred to be heat-treated. A gas distribution pipe is fixed to the inside wall of the reaction pipe for guiding the transfer of the wafers and supplying heat-treating gas in the reaction pipe. The distribution pipe is provided with a plurality of blow-off holes, the diameter thereof being made wider as the pipe extends longitudinally, to thereby control the gaseous atmosphere condition in the reaction pipe to be uniform.

5 Claims, 3 Drawing Figures

GASEOUS ATMOSPHERE CONTROL APPARATUS FOR A SEMICONDUCTOR MANUFACTURING SYSTEM

BACKGROUND OF THE INVENTION (1) Field of the Invention

The present invention relates to a gaseous atmosphere control apparatus for use in a semiconductor manufacturing system and more particularly for use in a semiconductor heat-treatment process.

(2) Description of the Prior Art

It is a well known matter that semiconductor wafers are heat-treated in the semiconductor manufacturing process. A conventional gaseous atmosphere control apparatus, therefore, is provided with a gas distribution pipe having a blow-off hole through which heat-treating gas is supplied. It is, however, a great disadvantage of the conventional apparatus that the gaseous atmosphere cannot be kept uniform during heat-treating process and the semiconductor wafers cannot be exposed to the uniform gaseous atmosphere.

SUMMARY OF THE INVENTION

It is, therefore, a primary object of this invention to provide a gaseous atmosphere control apparatus, wherein gaseous atmosphere is kept uniform.

It is another object of this invention to provide a gaseous atmosphere control apparatus, wherein a gas distribution pipe having a plurality of blow-off holes of different diameters is provided.

It is a further object of this invention to provide a gaseous atmosphere control apparatus, wherein a gas distribution pipe is so provided as to guide the transfer of semiconductor wafers.

DETAILED DESCRIPTION OF THE PREFERRED EMBODIMENT

Figure 1:
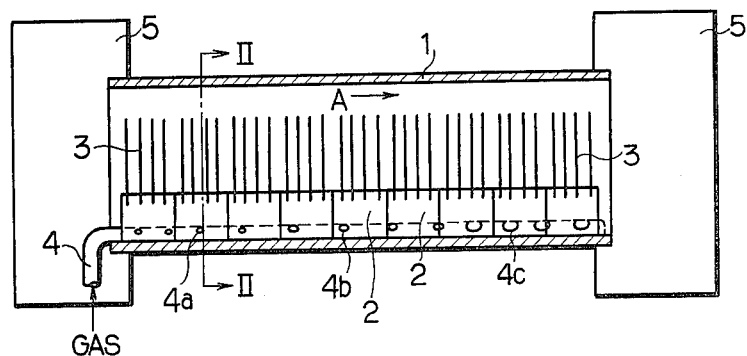
FIG. 1 is a schematic view illustrating a gaseous atmosphere control apparatus, in a preferred embodiment, according to the present invention.
Figure 2:
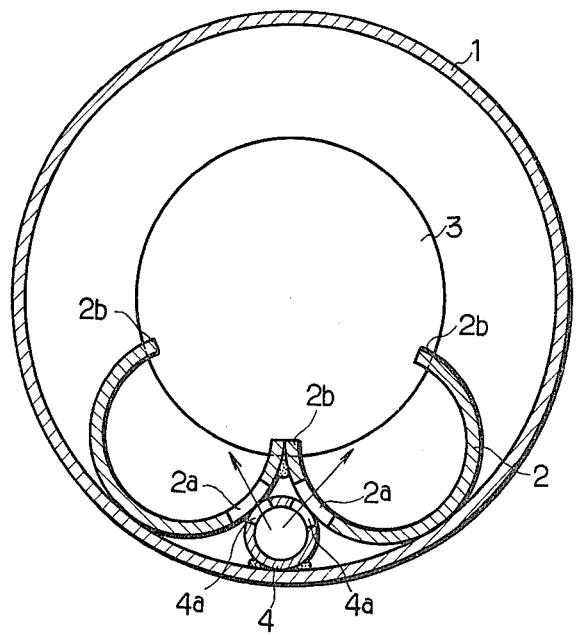
FIG. 2 is an enlarged sectional view taken along line II — II of FIG. 1.
Figure 3:
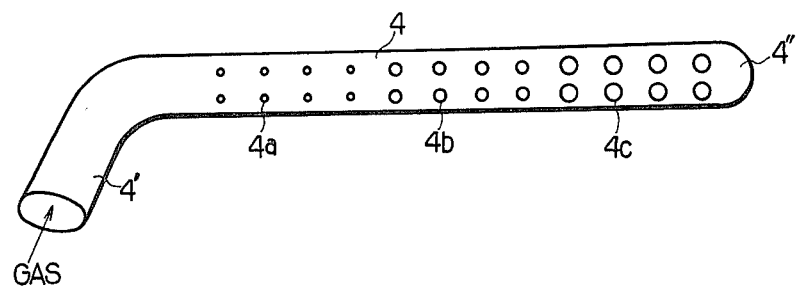
FIG. 3 is a perspective view illustrating the gas distribution pipe used in the preferred embodiment.

The present invention is described in detail hereinunder with reference to FIGS. 1 through 3. Referring first to FIG. 1 which illustrates a gaseous atmosphere control apparatus for heat-treating, particularly heat-diffusing, semiconductor wafers, reference nemeral 1 designates a reaction pipe, 2 a boat on which wafers 3 are loaded, 4 a gas distribution pipe having blow-off holes 4a, 4b and 4c and fixed to the inside wall of the reaction pipe 1 and 5 clean benches which includes, as known well in the art, devices for automatically transferring the boats 2 through the reaction pipe 1 in such a direction as shown with the arrow A. The clean benches 5 cut off the communication between the inner atmosphere of the reaction pipe 1 and the outer atmosphere.

The structure of the reaction pipe 1, the boat 2, the wafer 3 and the gas distribution pipe 4 is shown in FIG. 2. The reaction pipe 1 is formed into a cylindrical pipe and the distribution pipe 4 is so welded to the inside wall of the reaction pipe 1 as to extend longitudinally, in parallel with the central axis of the reaction pipe 1. The boat 2 is so formed as that the cross section thereof becomes the numerical character "3". The boat 2 is further provided with holes 2a and slits 2b by which the semiconductor wafer 3 is supported. The boat 2 loaded with the wafers 3 is slidably positioned in the reaction pipe 1 so that the longitudinal movement thereof is guided by the gas distribution pipe 4 and the holes 2a thereof communicates with the blow-off holes 4a of the gas distribution pipe 4.

The gas distribution pipe 4 has an open end 4' which is connectable to a gas supply source (not shown) and a closed end 4" as shown in FIG. 3. The blow-off holes 4a through 4c are provided between the end portions 4' and 4" in such a manner that hole diameter becomes wider as the blow-off hole becomes farther from the open end portion 4'.

Operation of the above-described gaseous atmosphere control apparatus is described hereinunder. Each boat 2 is sequentially pushed into the reaction pipe 1 from the left side clean bench 5 and the boat 2, contacting with the adjacent boats 2 and guided by the gas distribution pipe 4, is moved toward the right side clean bench 5 through the reaction pipe 1. As the boat 2 slides through the reaction pipe 1 longitudinally contacting with the gas distribution pipe 4 and the inside cylindrical wall of the reaction pipe 1, the lateral movement of the boat 2 rarely occurs to result in that semiconductor wafers 3 loaded on the boat 2 are transferred smoothly through the reaction pipe 1.

During the transfer of the wafer 3, the heat-treating gas (oxygen gas for example) is supplied to the gas distribution pipe 4 and blowed off through the blow-off holes 4a, 4b, and 4c. The gas amount blowed off through each hole can be made almost equal, because the holes 4a, 4b and 4c are widened as they become distant from the gas supply source. The gas, then, passes through the holes 2a of the boat 2 and occupies the inner space of the reaction pipe 1 to form the uniform gaseous atmosphere therein. The semiconductor wafers 3, therefore, are exposed to the uniform gas to be heat-diffused, while the boat is transferred through the reaction pipe 1. Thus assuring the uniform gaseous atmosphere in the reaction pipe 1, the oxide film of uniform thickness can be formed on the surface of the semiconductor wafer 3.

The oxide film of 7,600 A thickness could be formed on the wafer 3 according to the experiment, wherein the gas distribution pipe 4 is specified as follows:

material: glass
length: 2,000 mm
inner diameter: 8 mm
outer diameter: 10 mm
diameter of the blow-off hole 4a: 1 mm
diameter of the blow-off hole 4b: 3 mm
diameter of the blow-off hole 4c: 5 mm
longitudinal distance between blow-off holes: 150 mm
   heat-treating gas: oxygen
gas supply amount: 3,000 cc per minute.

Although the above embodiment is described with reference to the heat-diffusion treatment in the semiconductor manufacturing process, the gaseous atmosphere control apparatus is also applicable to the deposit-treatment, wherein nitrogen gas is blowed off from the gas distribution pipe 4. Whatever the heat-treatment method may be, the gas blow-off amount from the respective blow-off holes is nearly equal to each other to result in the formation of the uniform gaseous atmosphere which is advantageous in heat-treating the semiconductor wafers.

What we claim is:

1. A gaseous atmosphere control apparatus for a semiconductor manufacturing system comprising:
   a reaction pipe through which semiconductor wafers are transferred in the longitudinal direction thereof;
   a gas distribution pipe longitudinally fixed to the inside wall of said reaction pipe and having a plurality of blow-off holes for supplying heat-treating gas in said reaction pipe, the diameters of said blow-off holes increasing with increase in the distance from the gas inlet of said gas distribution pipe to thereby supply constant amount of heat-treating gas through each blow-off hole; and
   a boat positioned slidably in said reaction pipe to be moved therethrough guided by said gas distribution pipe and having slits in which said semiconductor wafers are supported, said boat having two circular walls which contact both said gas distribution pipe and the inside wall of said reaction pipe to prevent lateral movement of said boat.

2. A gaseous atmosphere control apparatus as claimed in claim 1, wherein said boat has holes which operatively contact with said blow-off holes to thereby pass said heat-treating gas therethrough.

3. A gaseous atmosphere control apparatus for a semiconductor manufacturing system comprising:
   a reaction pipe;
   a gas distribution pipe securely positioned in said reaction pipe in parallel with the central axis of said reaction pipe for supplying heat-treating gas, said gas distribution pipe having an open end and a closed end between which a plurality of blow-off holes are provided, said blow-off holes having different hole diameters to thereby supply constant amount of heat-treating gas therefrom; and
   a boat slidable in said reaction pipe for transferring semiconductor wafers through said reaction pipe to be heat-treated, the transferring direction of said boat being guided by said gas distribution pipe, said boat having two circular walls which contact both said gas distribution pipe and the inside wall of said reaction pipe to prevent lateral movement of said boat.

4. A gaseous atmosphere control apparatus for a semi-conductor manufacturing system comprising:
   a reaction pipe having a circular cross section and open ends at both ends thereof through which semiconductor wafers are transferred;
   a gas distribution pipe longitudinally fixed to the inside wall of said reaction pipe and having a plurality of blow-off holes for supplying heat-treating gas in said reaction pipe therefrom, the diameters of said blow-off holes increasing with increase in the distance from the gas inlet of said gas distribution pipe; and
   a boat positioned slidably in said reaction pipe to be longitudinally moved therethrough guided by said gas distribution pipe, said boat having slits for supporting said semiconductor wafers and having two circular walls each of which contacts both said gas distribution pipe and the inside wall of said reaction pipe to prevent lateral movement of said boat, said circular walls having respective holes which face said blow-off holes to allow said heat-treating gas to be supplied in said reaction pipe therethrough.

5. A gaseous atmosphere control apparatus for a semiconductor manufacturing system comprising:
   first pipe means having a closed end and an open end and provided with a plurality of holes through which gas is distributed, said holes having respective hole areas which increase with increase in the distance from said open end;
   second pipe means having two open ends and a circular wall portion, said second pipe means enclosing said first pipe means therein and said pipes extending in parallel; and
   support means for supporting semiconductor wafers to be treated by the gas distributed from said first pipe means in said second pipe means, said support means having two circular wall portions, whereby, when said support means is moved through said second means so that said semiconductor wafers are treated, said support means is guided by said first pipe means in such a manner that said circular wall portions of said support means contact said circular wall portion of said second pipe means.

* * * * *